(12) United States Patent
Tsuji

(10) Patent No.: US 6,608,505 B2
(45) Date of Patent: Aug. 19, 2003

(54) OUPUT BUFFER CIRCUIT

(75) Inventor: Nobuaki Tsuji, Hamamatus (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/795,884

(22) Filed: Feb. 28, 2001

(65) Prior Publication Data

US 2001/0017554 A1 Aug. 30, 2001

(30) Foreign Application Priority Data

Feb. 28, 2000 (JP) ........................................ 2000-052064

(51) Int. Cl.[7] ................................................ H03K 3/00
(52) U.S. Cl. .......................... 327/108; 327/109; 326/86; 326/87
(58) Field of Search ................................ 327/388, 389, 327/391, 379, 261, 264, 272, 278, 108, 112; 326/26, 21, 27, 87, 86, 82, 83

(56) References Cited

U.S. PATENT DOCUMENTS 5,237,213 A * 8/1993 Tanoi .......................... 327/205
5,923,192 A * 7/1999 Hasegawa .................... 327/112

* cited by examiner

Primary Examiner—My-Trang Nuton
Assistant Examiner—Hiep Nguyen
(74) Attorney, Agent, or Firm—Pillsbury Winthrop LLP

(57) ABSTRACT

An output buffer circuit is provided, which is capable of obtaining a large drive power when the level of an input signal changes, while allowing a through current to flow in suppressed amounts. A first P-channel MOS transistor and a first N-channel MOS transistor are connected in series with a power supply. The pair of transistors are exclusively switched on and off by an input signal such that the first and second switching elements are not simultaneously on or off, to deliver an output signal corresponding to the input signal, from a common junction between the first and second switching elements. A second P-channel MOS transistor is connected in parallel with the first P-channel MOS transistor as an auxiliary transistor. A second N-channel MOS transistor is connected in parallel with the first N-channel MOS transistor as an auxiliary transistor. When the level of the input signal changes to switch one of the first P-channel MOS transistor and N-channel MOS transistor from an OFF state to an ON state, a drive switching control block delivers a signal to one of the auxiliary transistors connected in parallel with the switched one of the first P-channel MOS transistor and N-channel MOS transistor, for holding the one of the auxiliary transistors in an ON state over a predetermined time period.

7 Claims, 11 Drawing Sheets

FIG. 11

| INPUT | | OUTPUT | OUTPUT | OUTPUT | FUNCTION |
|---|---|---|---|---|---|
| PCTL0 | PCTL1 | OUT2 | OUT4 | OUT8 | |
| L | L | L | H | H | LOW-SPEED MODE (USING 1ST OUTPUT BLOCK ALONE) |
| H | L | L | L | H | MIDDLE-SPEED MODE (USING 1ST AND 2ND OUTPUT BLOCKS) |
| H | H | L | L | L | HIGH-SPEED MODE (USING 1ST, 2ND AND 3RD OUTPUT BLOCKS) |

— LOW-SPEED MODE
········ MIDDLE-SPEED MODE
—·— HIGH-SPEED MODE

OUPUT BUFFER CIRCUIT

BACKGROUND OF THE INVENTION

1. Field of the Invention

This invention relates to an output buffer circuit for semiconductor integrated circuits.

2. Prior Art

In general, an LSI (Large Scale Integrated Circuit) has a large load connected to an output terminal thereof. Therefore, in order to drive such a large load, an output buffer circuit having a large drive power is usually provided in the output block of the LSI.

FIG. 1 shows the construction of a conventional output buffer circuit.

As shown in the figure, the output buffer circuit is comprised of a two-input NAND gate NAN1, an inverter IN1, a two-input NOR gate NOR1, a P-channel MOS transistor MP1, and an N-channel MOS transistor MN1.

The P-channel MOS transistor MP1 and the N-channel MOS transistor MN1 provide a sufficient drive power for driving an external load.

In the output buffer circuit constructed as above, if an input signal i changes from a low level to a high level when an enable signal en is at a low level, an output signal na1 from the two-input NAND gate NAN1 changes from a high level to a low level, and an output signal nr1 from the two-input NOR gate NOR1 also changes from a high level to a low level. Accordingly, the P-channel MOS transistor MP1 is switched from an OFF-state to an ON-state, while the N-channel MOS transistor MN1 is switched from the ON-state to the OFF-state. As a result, an output signal x changes from a low level to a high level.

During this transition of the output signal from the low level to the high level, there occurs a time period when the P-channel MOS transistor MP1 and the N-channel MOS transistor MN1 are both held in the ON-state simultaneously. During this time period, a large current (through current) flows between a power supply VDD and ground GND, which generates noise on the power line and the ground line, and can lead to erroneous operation of the LSI.

The above problem will be described more in detail with reference to FIG. 2.

FIG. 2 shows the P-channel MOS transistor MP1 and the N-channel MOS transistor MN1 each having an inductance L connected thereto.

These inductances L are parasitic inductances interposed, respectively, between the power supply VDD outside the LSI and the source of the MOS transistor MP1 inside the LSI and between the ground GDN outside the LSI and the source of the MOS transistor MN1 inside the LSI. When the through current i flows between the P-channel MOS transistor MP1 and the N-channel MOS transistor MN1 each connected to the corresponding inductance L, a spike noise is generated across each of the inductances L.

The noise level of the spike noise can be expressed in terms of a spike voltage ($\Delta V$) by the following equation (1):

$$\Delta V = -L \cdot di/dt \quad (1)$$

In the output buffer circuit, since the P-channel MOS transistor MP1 and the N-channel MOS transistor MN1 each have a large load-driving power, a large through current i flows between them, which generates a large spike noise.

The generation of the big spike noise leads to erroneous operations of other circuits within the LSI.

Further, the FIG. 1 output buffer circuit suffers from a problem that the through current causes an increased current consumed by the buffer circuit.

An output buffer circuit intended for preventing generation of the through current and noise described above has been proposed e.g. by Japanese Laid-Open Patent Publication (Kokai) No. 05-327444.

FIG. 3 shows the construction of the proposed output buffer circuit.

The output buffer circuit is comprised of an input terminal 1, an output terminal 2, a pre-driver 3, a delay circuit block 4, and a final driver 5.

The final driver 5 is comprised of P-channel MOS transistors P1, P2, and N-channel MOS transistors N1, N2. The P-channel MOS transistors P1, P2 each have a source thereof connected to a positive power supply VDD, while the N-channel MOS transistors N1, N2 each have a source thereof grounded. The P-channel MOS transistors P1, P2 and the N-channel MOS transistors N1, N2 each have a drain thereof connected to the output terminal 2.

The delay circuit block 4 is interposed between the input terminal 1 and the final driver 5 and composed of a delay block 6, a two-input NAND gate 11, and a two-input NOR gate 12. The delay block 6 delays an input signal thereto by a predetermined delay amount td. An output signal from the delay block 6 is delivered to one of the input terminals of the two-input NAND gate 11 and one of the input terminals of the two-input NOR gate 12. The other input terminal of the two-input NAND gate 11 and that of the two-input NOR gate 12 are each supplied with an input signal i. The two-input NAND gate 11 supplies an output signal to the gate of the P-channel MOS transistor P2 of the final driver 5, while the two-input NOR gate 12 supplies an output signal to the gate of the N-channel MOS transistor N2 of the same.

The pre-driver 3 is interposed between the input terminal 1 and the final driver 5. The pre-driver 3 delivers a signal formed by inverting the polarity of the input signal i to the respective gates of the P-channel and N-channel MOS transistors P1 and N1 of the final driver 5.

Next, the operation of the above output buffer circuit will be described with reference to FIGS. 4A to 4J.

FIGS. 4A to 4J collectively form a timing chart which is useful in explaining the operation of the FIG. 3 output buffer circuit.

First, assuming that the input signal i changes from a low level to a high level at a time t01, the output signal from the pre-driver 3 changes from a high level to a low level (see FIGS. 4A, 4B). As a result, the P-channel MOS transistor P1 is switched from the OFF-state to the ON-state, while the N-channel MOS transistors N1 is switched from the ON-state to the OFF-state (see FIGS. 4F, 4G). Accordingly, an output signal from the final driver starts changing from a low level to a high level (FIG. 4J).

After the lapse of a delay time td from the time t01 (i.e. at a time t02), the output signal from the delay block 6 changes from a low level to a high level (see FIG. 4C). At the same time, the output signal from the two-input NAND gate 11 changes from a high level to a low level (see FIG. 4E), whereby the P-channel MOS transistor P2 is switched from the OFF-state to the ON-state (see FIG. 4H).

Consequently, the P-channel MOS transistors P1 and P2 perform additional driving operation to cause an output signal level to rise sharply.

In the output buffer circuit described above, between the time t01 at which the input signal i changes and the time t02 after the lapse of the delay time td from the time t01, there exists no time period over which the P-channel MOS transistor P2 and the N-channel MOS transistor N2 are both held in the ON-state simultaneously (see FIGS. 4H, 4I), which prevents a through current from flowing between the two transistors P2 and N2.

However, when a large capacity load connected to the output buffer circuit is to be charged or discharged, a large drive power is required upon switching between the charge and the discharge. In the above output buffer circuit, when the input signal i changes from the low level to the high level, one of the P-channel MOS transistors parallel-connected to the load, i.e. the P-channel MOS transistor P1, is switched from the OFF-state to the ON-state (see FIG. 4F), while the P-channel MOS transistor P2 is switched from the OFF-state to the ON-state after the lapse of the delay time td (see FIG. 4H).

That is, immediately after the input signal i changes as described above, the P-channel MOS transistor P1 alone can provide a drive power. Therefore, it is impossible to obtain a sufficient drive power for charging or discharging the large capacity load, which results in delayed response.

SUMMARY OF THE INVENTION

It is an object of the present invention to provide an output buffer circuit which is capable of obtaining a large drive power when the level of an input signal changes, while allowing a through current to flow in suppressed amounts.

Further, since the output signal x is at the low level, the output signal x2 from the delay block 210 is held at a high level, and the output signal a2 from the AND gate AND1 and the output signal r2 from the OR gate OR1 are also each held at a high level.

To attain the above object, there is provided an output buffer circuit comprising a pair of first and second switching elements that are connected with each other at a common junction and connected in series with a power supply, for being exclusively switched on and off in response to an input signal such that the first and second switching elements are not simultaneously on or off, to deliver an output signal corresponding to the input signal, from the common junction, a first auxiliary switching device that is connected in parallel with the first switching element, a second auxiliary switching device that is connected in parallel with the second switching element and a drive switching control block that operates when a change occurs in level of the input signal and one of the first and second switching elements is switched from an OFF state to an ON state in response to the change in level of the input signal, to deliver auxiliary drive control signals to the of the first and second auxiliary switching devices which is connected in parallel with the switched one of the first and second switching elements, for holding the one of the first and second auxiliary switching devices in an ON state over a predetermined time period.

More preferably, the first and second auxiliary switching devices are each formed by a plurality of switching elements, the output buffer circuit including a selection control signal supply device that supplies the drive switching control block with selection control signals for selecting or not selecting at least one of the plurality of switching elements to be supplied with auxiliary drive control signals, and when the level of the input signal changes to switch one of the first and second switching elements from an OFF state to an ON state, the drive switching control block delivers auxiliary drive control signals to the selected at least one of the plurality of switching elements of one of the first and second auxiliary switching devices which is connected in parallel with the switched one of the first and second switching elements, for holding the selected at least one off the plurality of switching elements in the ON state over the predetermined time period.

More preferably, the selection control signal supply device supplies selection control signal such that more of the plurality of switching elements are selected to be supplied with auxiliary drive control signal to thereby increase a speed of rise of the output signal.

Preferably, the drive switching control block includes a delay circuit that delays the output signal delivered from the common junction between the first and second switching elements, and wherein the drive switching control block delivers auxiliary drive control signal over a time period during which a level of an output signal from the delay circuit and the level of the input signal are the same as each other.

Alternatively, the drive switching control block includes a delay circuit that delays the input signal, and the drive switching control block delivers auxiliary drive control signals over a time period during which a level of an output signal from the delay circuit and the level of the input signal are the same as each other.

More preferably, the delay circuit delays the output signal delivered from the common junction between the first and second switching elements by a delay time dependent on a speed of switching operation demanded of the output buffer circuit.

More preferably, the delay circuit delays the input signal by a delay time dependent on a speed of switching operation demanded of the output buffer circuit.

The above and other objects, features, and advantages of the present invention will become more apparent from the following detailed description taken in conjunction with the accompanying drawings.

BRIEF DESCRIPTION OF THE DRAWINGS

FIG. 11 shows a table which is useful in explaining the functions of the control signal-generating block 600;

DETAILED DESCRIPTION OF THE PREFERRED EMBODIMENTS

The present invention will now be described in detail with reference to the drawings showing embodiments thereof. The following description is provided for the purposes of further ease of understanding of the present invention, and the embodiments described therein are by no means intended to limit the present invention, but given only by way of example. Therefore, further modifications and variations may be made without departing from the spirit and scope of the present invention.

Figure 5:
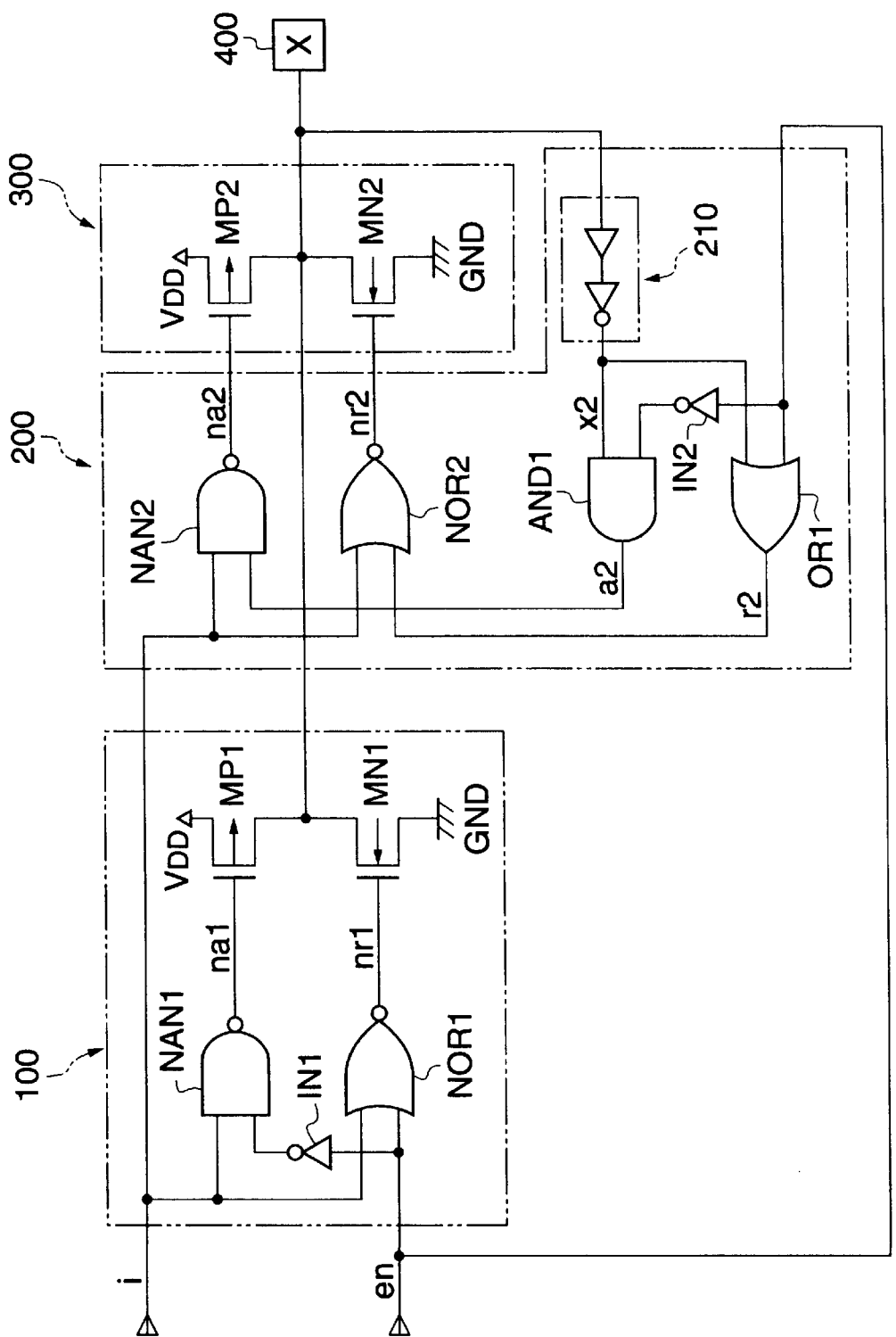
FIG. 5 is a circuit diagram showing the construction of an output buffer circuit according to a first embodiment of the present invention.

FIG. 5 shows the construction of an output buffer circuit according to a first embodiment of the present invention.

Figure 1:
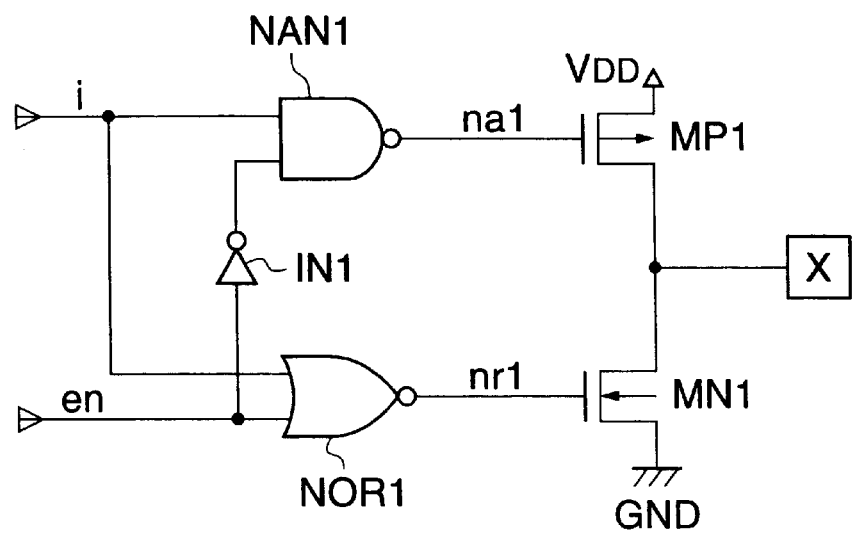
FIG. 1 is a circuit diagram showing the construction of a conventional output buffer circuit.
Figure 2:
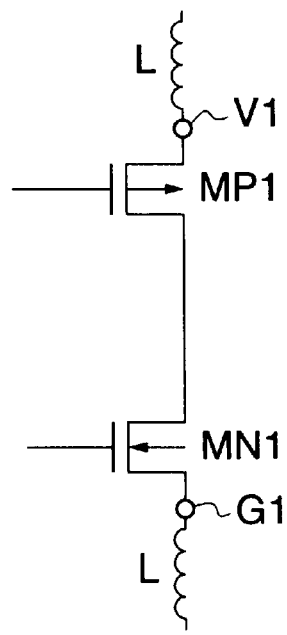
FIG. 2 is a diagram showing part of the conventional output buffer circuit.
Figure 3:
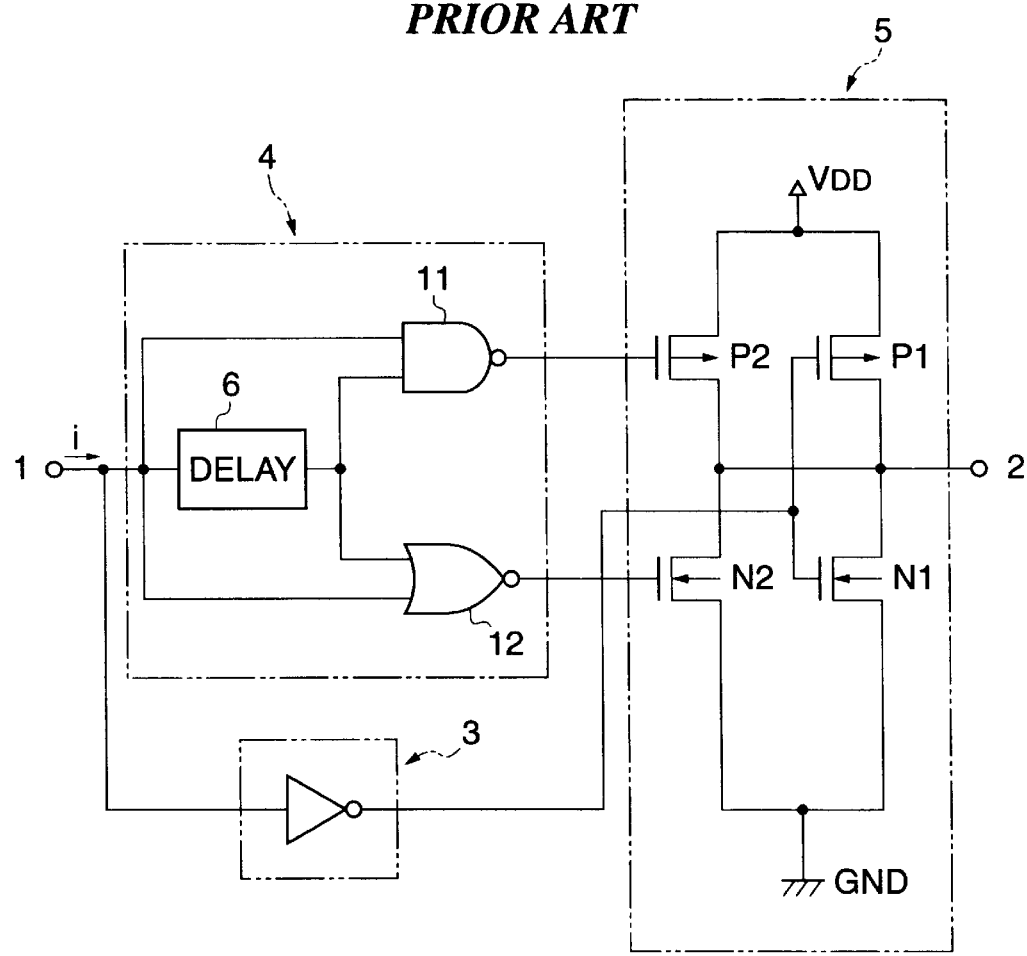
FIG. 3 is a circuit diagram showing the construction of another conventional output buffer circuit.
Figure 4A:
FIGS. 4A to 4J collectively form a timing chart useful in explaining the operation of the FIG. 3 output buffer circuit.
Figure 4B:
Figure 4C:
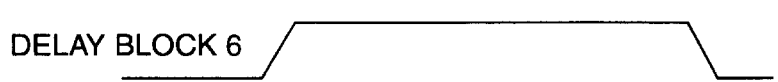
Figure 4D:
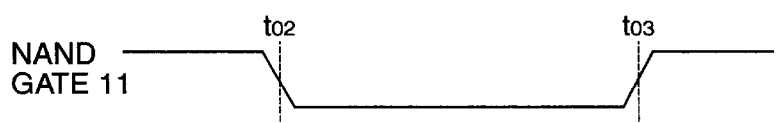
Figure 4E:
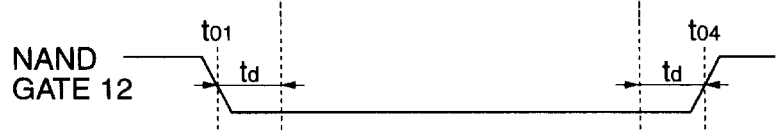
Figure 4F:
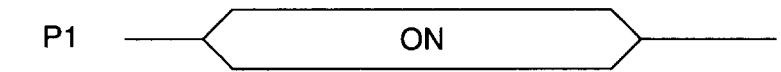
Figure 4G:
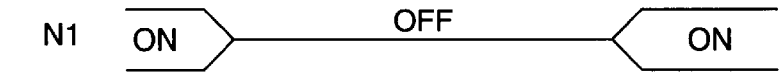
Figure 4H:
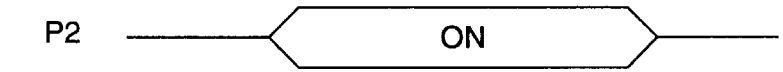
Figure 4I:
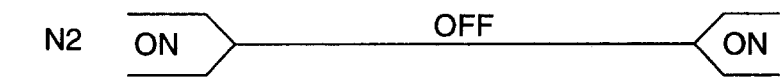
Figure 4J:
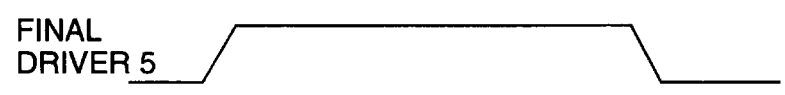

The output buffer circuit is comprised of a combination of a first output block 100 which is identical with the FIG. 1 output buffer circuit, and a drive switching control block 200 and a second output block 300 which are newly added in the present embodiment.

The first output block 100 delivers a signal having a level corresponding to that of an input signal i to an output terminal 400 when an enable signal en is at a low level. The first output block 100 is constructed similarly to the FIG. 1 output buffer circuit, and therefore, component parts and elements corresponding to those of the FIG. 1 output buffer circuit described hereinbefore are designated by identical reference numerals, and detailed description thereof is omitted.

The drive switching control block 200 is comprised of a delay block 210, a two-input AND gate AND1, a two-input OR gate OR1, an inverter IN2, a two-input NAND gate NAN2, and a two-input NOR gate NOR2.

The delay block 210 delays an output signal x from the output buffer circuit by a delay time td, and delivers a signal x2 formed by inverting the polarity of the output signal x to one of the input terminals of the two-input AND gate AND1 and one of the input terminals of a two-input OR gate OR1.

The other input terminal of the two-input AND gate AND1 is supplied with a signal from the inverter IN2 which inverts the polarity of an enable signal en, while the other input terminal of the two-input OR gate OR1 is supplied with the enable signal en.

An output signal a2 from the two-input AND gate AND1 is supplied to one of the input terminals of the two-input NAND gate NAN2, while an output signal r2 from the two-input OR gate OR1 is supplied to one of the input terminals of the two-input NOR gate NOR2.

The other input terminal of each of the two-input NAND gate NAN2 and the two-input NOR gate NOR2 is supplied with an input signal i. The two-input NAND gate NAN2 and the two-input NOR gate NOR2 deliver respective output signals na2 and nr2 to the second output block 300.

The second output block 300 is comprised of a P-channel MOS transistor MP2, and a N-channel MOS transistor MN2.

The P-channel MOS transistor MP2 has a source thereof connected to a power supply VDD, while the N-channel MOS transistor MN2 has a source thereof grounded. Further, the P-channel MOS transistor MP2 and the N-channel MOS transistor MN2 have respective drains thereof commonly connected to the output terminal 400 of the LSI. The P-channel MOS transistor MP2 and the N-channel MOS transistor MN2 cooperatively provide an augmenting drive power to make up for the drive power obtained from the P-channel MOS transistor MP1 and the N-channel MOS transistor MN1.

FIGS. 6A to 6L collectively form a timing chart which is useful in explaining the operation of the FIG. 5 output buffer circuit. In the following, the operation of the output buffer circuit according to the present embodiment will be described with reference to the timing chart.

First, let it be assumed that the enable signal en is at a low level, and the input signal i is also at a low level. In this state, the output signal na1 from the NAND gate NAN1 is held at a high level, and the output signal nr1 from the NOR gate NOR1 is also held at a high level, so that the N-channel MOS transistor MN1 is held in an ON-state. Therefore, the output signal x from the output terminal 400 of the LSI is held at a low level (see FIGS. 6A to 6E).

Further, since the output signal x is at the low level, the output signal x2 from the delay block 210 is held at a high level, and the output signal a2 from the AND gate AND1 and the output signal r2 from the OR gate OR1 are also each held at a high level.

As a result, since the NAND gate NAN2 receives the high-level signal a2 and the low-level input signal i, an output signal na2 from the NAND gate NAN2 is held at a high level.

On the other hand, since the NOR gate NOR2 receives the high-level signal r2 and the low-level input signal i, an output signal nr2 from the NOR gate NOR2 is held at a low level.

Accordingly, the P-channel MOS transistor MP2 and the N-channel MOS transistor MN2 in the second output block 300 are each held in an OFF-state (see FIGS. 6F, 6G, 6H, 6K and 6L).

Figure 6:
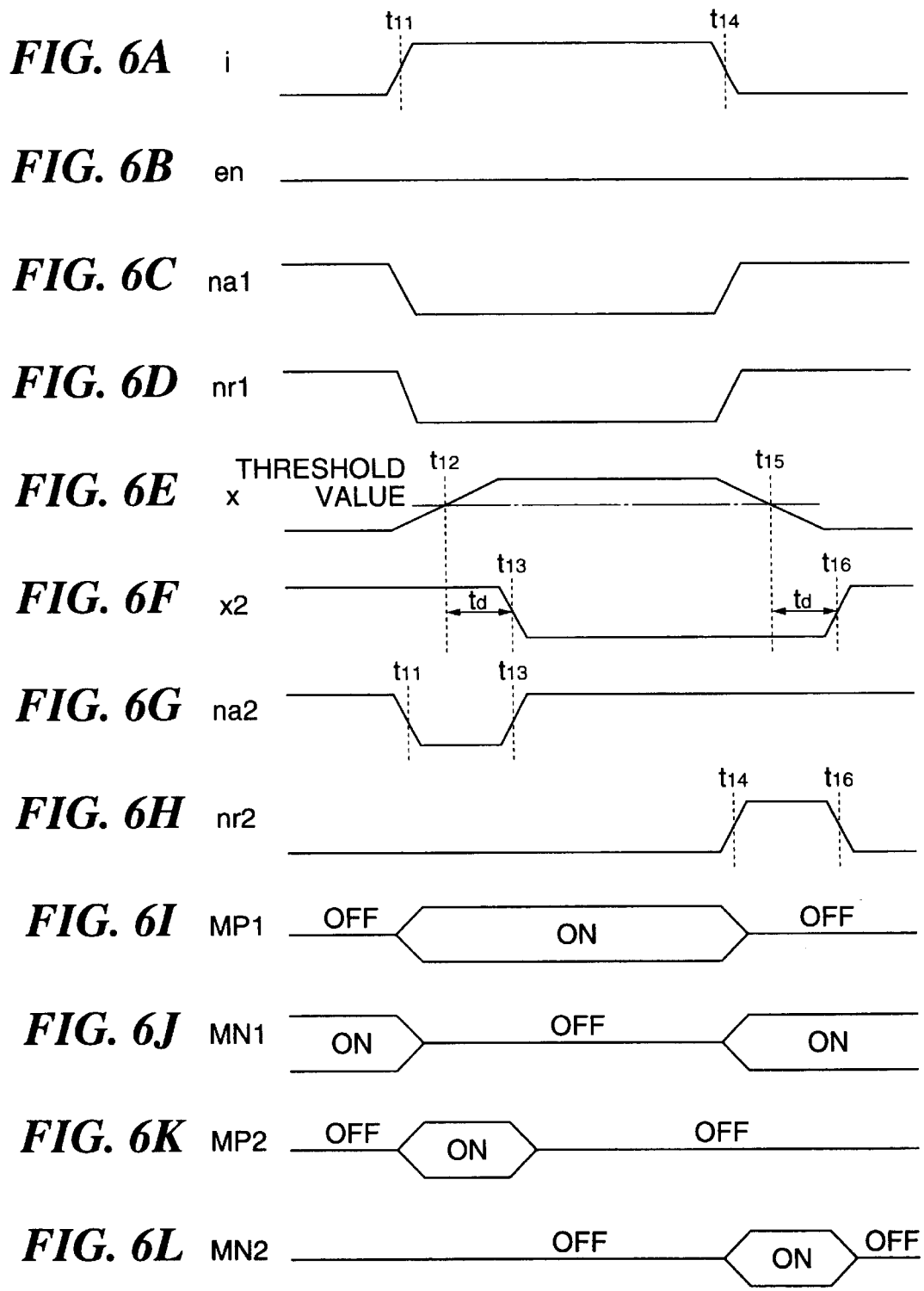
FIGS. 6A to 6L collectively form a timing chart useful in explaining the operation of the FIG. 5 output buffer circuit.

Next, let it be assumed that the input signal i changes at a time t11 from the low level to a high level (see FIG. 6A).

As a result, in the first output block 100, the P-channel MOS transistor MP1 is switched from the OFF-state to the ON-state, while the N-channel MOS transistor MN1 is switched from the ON-state to the OFF-state (see FIGS. 6I and 6J). Accordingly, the output signal x from the output terminal 400 starts changing from the low level to a high level (FIG. 6E).

During the transition of the output signal x from the low level to the high level, as long as the level of the output signal x is lower than a threshold value at the input of the delay block 210, the output signal x2 from the delay block 210 is held at the high level, so that the high-level signal a2 is supplied to the NAND gate NAN2, and the high-level signal r2 to the NOR gate NOR2.

Therefore, when the input signal i changes from the low level to the high level at the time t11, the output signal na2 from the NAND gate NAN2 changes from the high level to the low level in response to the change in the level of the input signal i. As a result, in the second output block 300, the P-channel MOS transistor MP2 is switched from the OFF-state to the ON-state.

Thus, at the time point the input signal i changes from the low level to the high level, charge of a load, not shown, connected to the output terminal 400 via the P-channel MOS transistor MP1 in the first output block 100 and the P-channel MOS transistor MP2 in the second output block 300 is started, and the level of the output signal x is progressively raised.

Then, after the level of the output signal x exceeds the threshold value at the input of the delay block 210 at a time t12, the output signal x2 from the delay block 210 changes from the high level to a low level at a time t13 when the delay time td has elapsed after the time point t12 (see FIG. 6F), whereby the output signal a2 from the AND gate AND1 and the output signal r2 from the OR gate OR1 are both changed to low levels.

As a result, the output signal na2 from the NAND gate NAN2 changes to a high level (see FIG. 6G), whereby the P-channel MOS transistor MP2 returns to the OFF-state (see FIG. 6K). After the P-channel MOS transistor MP2 having been thus turned off, only the P-channel MOS transistor MP1 in the first output block 100 remains in the ON-state.

As described above, the P-channel MOS transistor MP2 is not turned off until the delay time td has elapsed after the level of the output signal x exceeded the threshold value at the input of the delay block 210. In this case, the delay time td is set to a time period over which the output signal x completes a rise in level after its level has exceeded the threshold value at the input of the delay block 210. Therefore, at the time point the P-channel MOS transistor MP2 is turned off, the output signal x has already changed to the high level.

Next, let it be assumed that the input signal i changes from the high level to the low level at a time t14 (see FIG. 6A).

As a result, in the first output block 100, the P-channel MOS transistor MP1 is switched from the ON-state to the OFF-state, while the N-channel MOS transistor MN1 is switched from the OFF-state to the ON-state (see FIGS. 6I and 6J).

Accordingly, the output signal x from the output terminal 400 starts changing from the high level to the low level (FIG. 6E).

During the transition of the output signal x from the high level to the low level, as long as the level of the output signal x is higher than the threshold value at the input of the delay block 210, the output signal x2 from the delay block 210 is held at the low level, so that the low-level signal a2 is supplied to the NAND gate NAN2, and the low-level signal r2 to the NOR gate NOR2.

Therefore, when the input signal i changes from the high level to the low level at the time t14, the output signal nr2 from the NOR gate NOR2 changes from the low level to the high level in response to the change in the level of the input signal i. As a result, in the second output block 300, the N-channel MOS transistor MN2 is switched from the OFF-state to the ON-state.

Thus, at the time point the input signal i changes from the high level to the low level, discharge of the load, not shown, connected to the output terminal 400 via the N-channel MOS transistor MN1 in the first output block 100 and the N-channel MOS transistor MN2 in the second output block 300 is started, and the level of the output signal x is progressively lowered.

Then, after the level of the output signal x becomes lower than the threshold value at the input of the delay block 210 at a time t15, the output signal x2 from the delay block 210 changes from the low level to the high level at a time t16 the delay time td has elapsed after the time point t15 (see FIG. 6F), whereby the output signal a2 from the AND gate AND1 and the output signal r2 from the OR gate OR1 are changed to the high levels.

As a result, the output signal nr2 from the NOR gate NOR2 changes to the low level (see FIG. 6H), whereby the N-channel MOS transistor MN2 returns to the OFF-state (see FIG. 6L). After the N-channel MOS transistor MN2 having been thus turned off, only the N-channel MOS transistor MN1 in the first output block 100 is held in the ON-state.

As described above, the N-channel MOS transistor MN2 is not turned off until the delay time td has elapsed after the level of the output signal x became lower than the threshold value at the input of the delay block 210. In this case, the delay time td is set to a time period over which the output signal x completes a fall in level after its level has become lower than the threshold value at the input of the delay block 210. Therefore, at the time point the N-channel MOS transistor MN2 is turned off, the output signal x has already changed to the low level.

As described above, according to the present embodiment, even when the signal level of the input signal i changes, the P-channel MOS transistor MP2 and the N-channel MOS transistor MN2 in the second output block 300 are never simultaneously brought into the ON-state, which prevents a through current from flowing in the second output block 300.

Further, after the input signal i has changed from the low level to the high level, the N-channel MOS transistor MN2 in the second output block 300 is held in the OFF-state (see FIG. 6L).

On the other hand, after the input signal i has changed from the high level to the low level, the P-channel MOS transistor MP2 in the second output block 300 is held in the OFF-state (see FIG. 6K).

Thus, after the level of the input signal i has changed, in the second output block 300, either the P-channel MOS transistor MP2 or the N-channel MOS transistor MN2 is held in the OFF-state. This makes it possible to prevent an increase in electric power required for control of the output buffer circuit.

Still further, when the input signal i changes from the low level to the high level, the two P-channel MOS transistors in the first and second output blocks 100 and 300 start charging the load, while when the input signal i changes from the high level to the low level, the two N-channel MOS transistors in the first and second output blocks 100 and 300 start discharging the load.

Therefore, the output buffer circuit of the above embodiment makes it possible to charge or discharge a large-capacity load promptly in response to a change in the level of the input signal i.

Moreover, the output buffer circuit of the present embodiment makes it possible to reduce the sizes of transistors forming the NOR gate NOR2 and the NAND gate NAN2 in the drive switching control block 200. The reasons for this are as follows:

(1) Transistors Forming the NOR Gate NOR2

When the input signal i changes from the low level to the high level, the output signal nr2 from the NOR gate NOR2 is not changed but held at the low level (see FIG. 6H). Therefore, it is possible to reduce the sizes of N-channel MOS transistors forming the NOR gate NOR2 for switching the N-channel MOS transistor MN2 in the second output block 300 from the ON-state to the OFF-state, thereby reducing power consumption.

(2) Transistors Forming the NAND Gate NAN2

When the input signal i changes from the high level to the low level, the output signal na2 from the NAND gate NAN2 is not changed but held at the high level (see FIG. 6G). Therefore, it is possible to reduce the sizes of N-channel MOS transistors forming the NAND gate NAN2 for switching the P-channel MOS transistor MP2 in the second output block 300 from the ON-state to the OFF-state, thereby reducing power consumption.

Next, an output buffer circuit according to a second embodiment will be described with reference to FIGS. 7 and 8.

Figure 7:
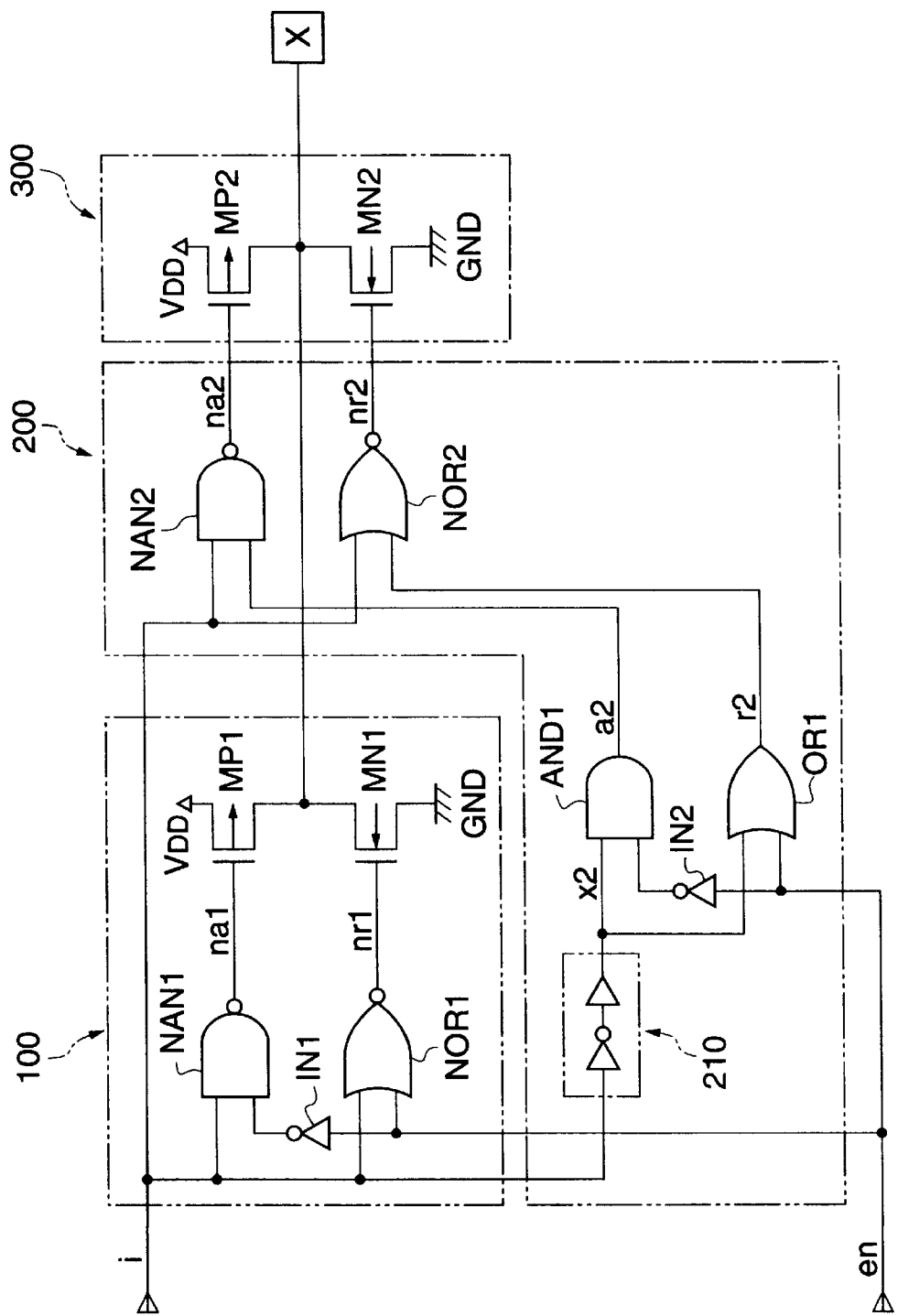
FIG. 7 is a circuit diagram showing the construction of an output buffer circuit according to a second embodiment of the present invention.
Figure 8:
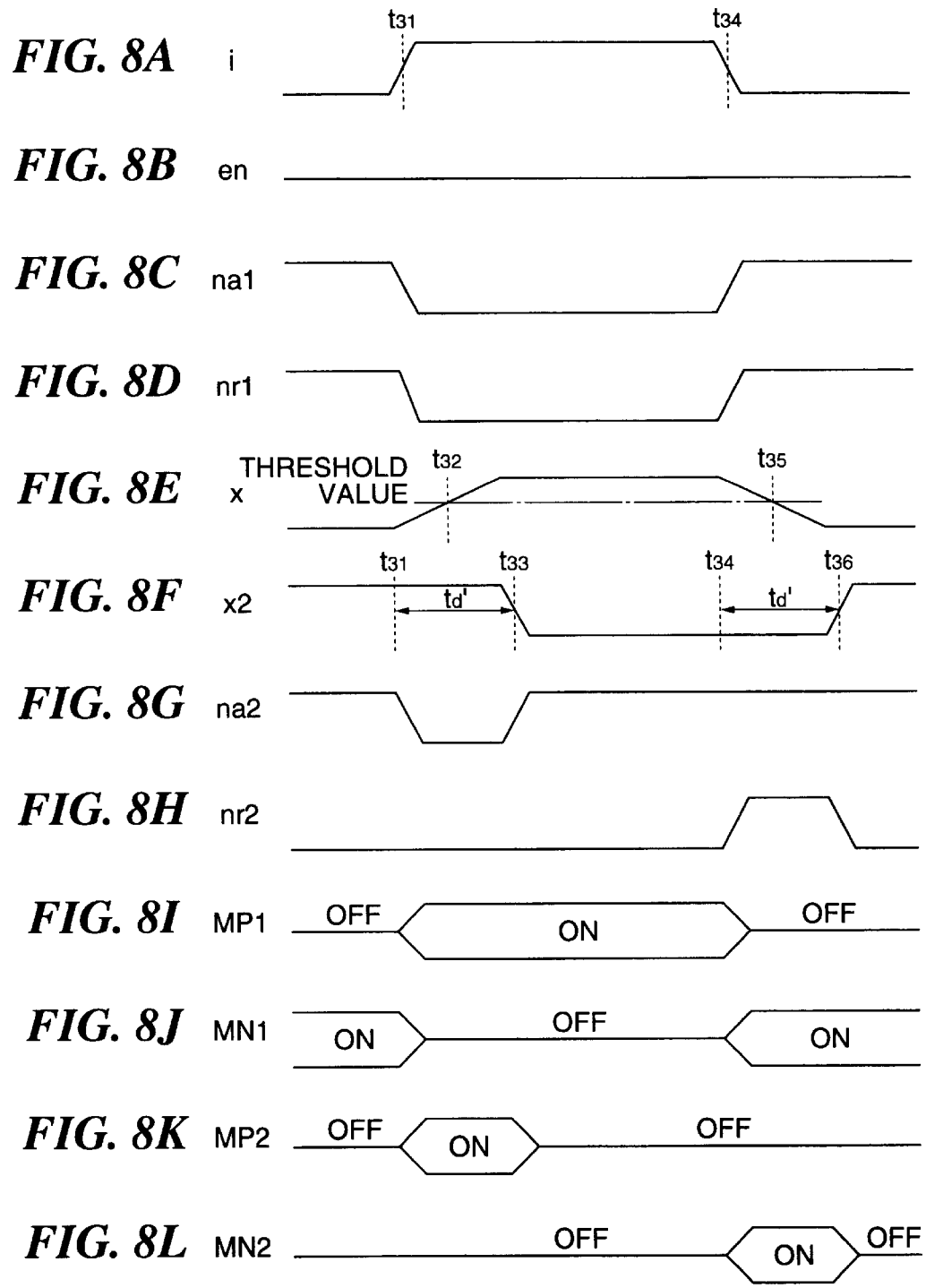
FIGS. 8A to 8L collectively form a timing chart useful in explaining the operation of the FIG. 7 output buffer circuit.

As shown in FIG. 7, the output buffer circuit according to the present embodiment is distinguished from the output buffer circuit according to the first embodiment in which the output signal x is supplied to the delay block 210, in that an input signal i is supplied to a delay block 210. It should be noted that component parts and elements corresponding to those of the output buffer circuit according to the first embodiment are designated by identical reference numerals, and detailed description thereof is omitted.

FIGS. 8A to 8L collectively form a timing chart which is useful in explaining the operation of the FIG. 7 output buffer circuit. In the following, the operation of the output buffer circuit according to the present embodiment will be described with reference to the timing chart.

First, let it be assumed that an enable signal en is at a low level, and the input signal i is also at a low level. The operation of the output buffer circuit in this state is similar to that of the output buffer circuit of the first embodiment, and therefore, description thereof is omitted.

Next, let it be assumed that the input signal i changes from the low level to a high level at a time t31 (see FIG. 8A).

As a result, in a first output block 100, a P-channel MOS transistor MP1 is switched from the OFF-state to the ON-state, while an N-channel MOS transistor MN1 is switched from the ON-state to the OFF-state. Consequently, an output signal from the first output block 100 starts changing from a low level to a high level (FIG. 8E).

In this embodiment, the input signal i is supplied to an input of the delay block 210, which means that at the time t31, the input of the delay block 210 receives the high-level input signal.

However, the delay block 210 delivers an output signal x2 formed by delaying the input signal i by a predetermined delay amount td', so that at the time t31 when the input signal i changes from the low level to the high level, the output signal x2 from the delay block 210 remains at a high level. Therefore, a high-level signal a2 from an AND gate AND1 is supplied to a NAND gate NAN2, while a high-level signal r2 from an OR gate OR1 is supplied to a NOR gate NOR2.

On the other hand, an output signal na2 from a NAND gate NAN2 changes from a high level to a low level in response to the change in the level of the input signal i at the time t31. As a result, in a second output block 300, a P-channel MOS transistor MP2 is switched from the OFF-state to the ON-state.

Accordingly, at the time point the input signal i changes from the low level to the high level, charge of a load, not shown, connected to an output terminal 400 via the P-channel MOS transistor MP1 in the first output block 100 and the P-channel MOS transistor MP2 in the second output block 300 is started, and the level of the output signal x is progressively raised.

Then, at a time t33 the delay time td' has elapsed after the transition of the input signal i from the low level to the high level, the output signal x2 from the delay block 210 changes from the high level to a low level (see FIG. 8F), whereby the output signal a2 from the AND gate AND1 and the output signal r2 from the OR gate OR1 are both changed to low levels.

As a result, the output signal na2 from the NAND gate NAN2 changes to the high level (see FIG. 8G), whereby the P-channel MOS transistor MP2 returns to the OFF state (see FIG. 8K). After the P-channel MOS transistor MP2 having been thus turned off, only the P-channel MOS transistor MP1 in the first output block 100 remains in the ON-state.

As described above, the output signal x2 does not change from the low level to the high level until the delay time td' has elapsed after the transition of the input signal i from the low level to the high level (FIG. 8F).

In the present embodiment, the delay time td' is set to a time period over which the output signal x completes a rise from the low level to the high level after the transition of the input signal i from the low level to the high level.

Therefore, at the time point the output signal x2 from the delay block 210 changes from the high level to the low level (see FIG. 8F), the output signal x has already changed to the high level.

When the input signal i changes from the high level to the low level, the output buffer circuit operates similarly to the output buffer circuit of the first embodiment, and therefore, description of the operation is omitted.

As described above, according to the present embodiment, even when the signal level of the input signal i changes from the low level to the high level, the P-channel MOS transistor MP2 and the N-channel MOS transistor MN2 in the second output block 300 are not both turned on. Therefore, similarly to the first embodiment, the second embodiment makes it possible to prevent a through current from flowing in the second output block 300, thereby reducing power consumption by the output buffer circuit.

Next, an output buffer circuit according to a third embodiment will be described with reference to FIGS. 9 to 13.

Figure 9:
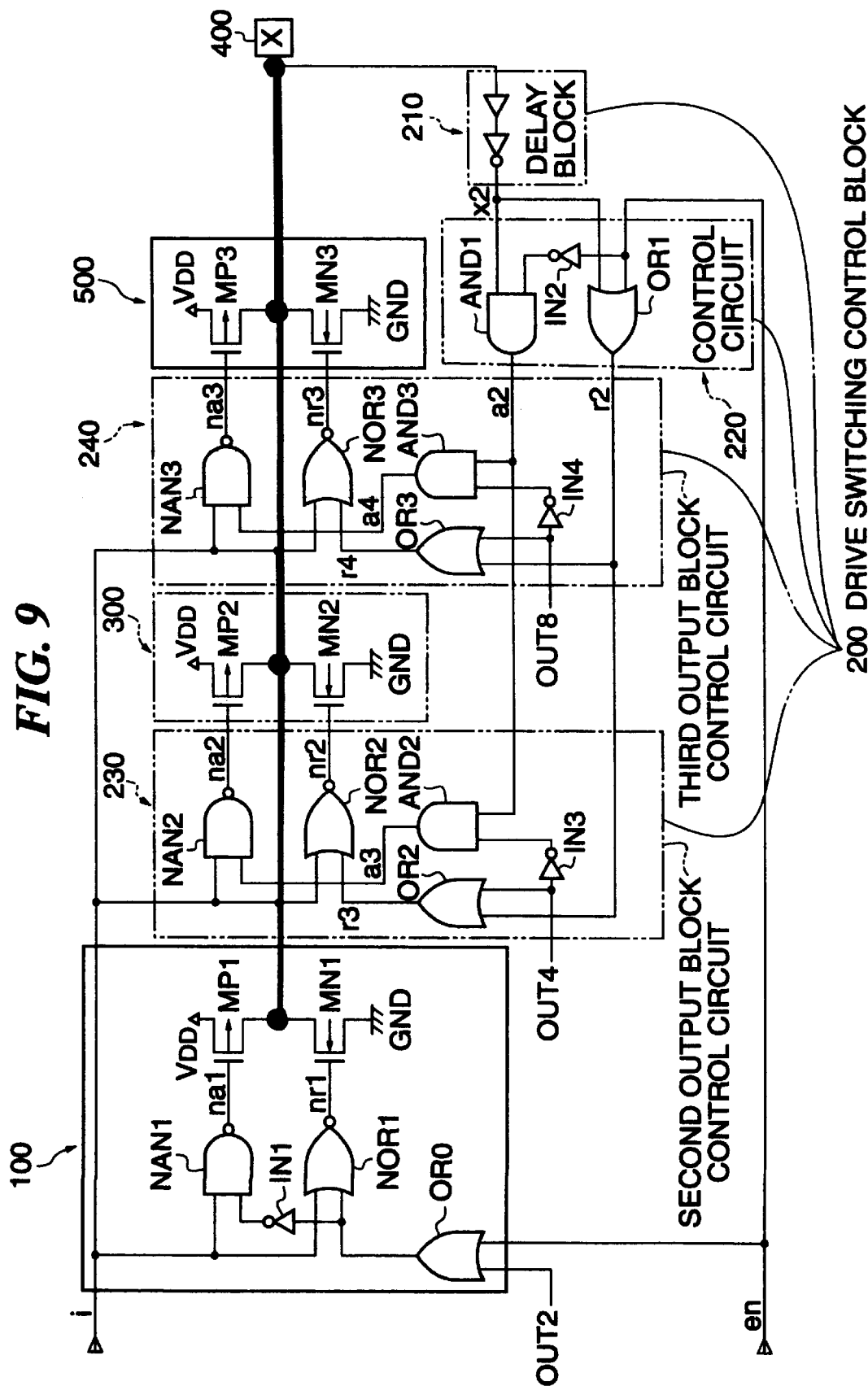
FIG. 9 is a circuit diagram showing the construction of an output buffer circuit according to a third embodiment of the present invention.

FIG. 9 shows the construction of the output buffer circuit according to the present embodiment.

The output buffer circuit is comprised of a first output block 100', a second output block 300, a third output block 500, and a drive switching control block 200'.

The first output block 100' is distinguished from the first output block 100 of the output buffer circuit according to the first embodiment (shown in FIG. 5) in that a two-input OR gate OR0 is provided at a location upstream of a two-input NOR gate NOR1 and an inverter IN1. One of the input terminals of the two-input OR gate OR0 is supplied with an enable signal en, while the other is supplied with a control signal OUT2, described in detail hereinafter.

Similarly to the output buffer circuit according to the first embodiment, the output buffer circuit of the second embodiment has the second output block 300 for providing an augmenting drive power to make up for the drive power obtained from the first output block 100'.

In the present embodiment, in addition to the second output block 300, the third output block 500 also provides an augmenting drive power to make up for the drive power obtained from the first output block 100'. As shown in FIG. 9, the third output block 500 is comprised of a P-channel MOS transistor MP3, and an N-channel MOS transistor MN3.

According to the present embodiment, it is possible to drive a load connected to an output terminal 400 in the following three modes:

a. The load is driven only by the first output block 100' (low-speed mode).
b. The load is driven by the first output block 100' and the second output block 300 (middle-speed mode).
c. The load is driven by the first output block 100', the second output block 300 and the third output block 500 (high-speed mode).

Figure 10:
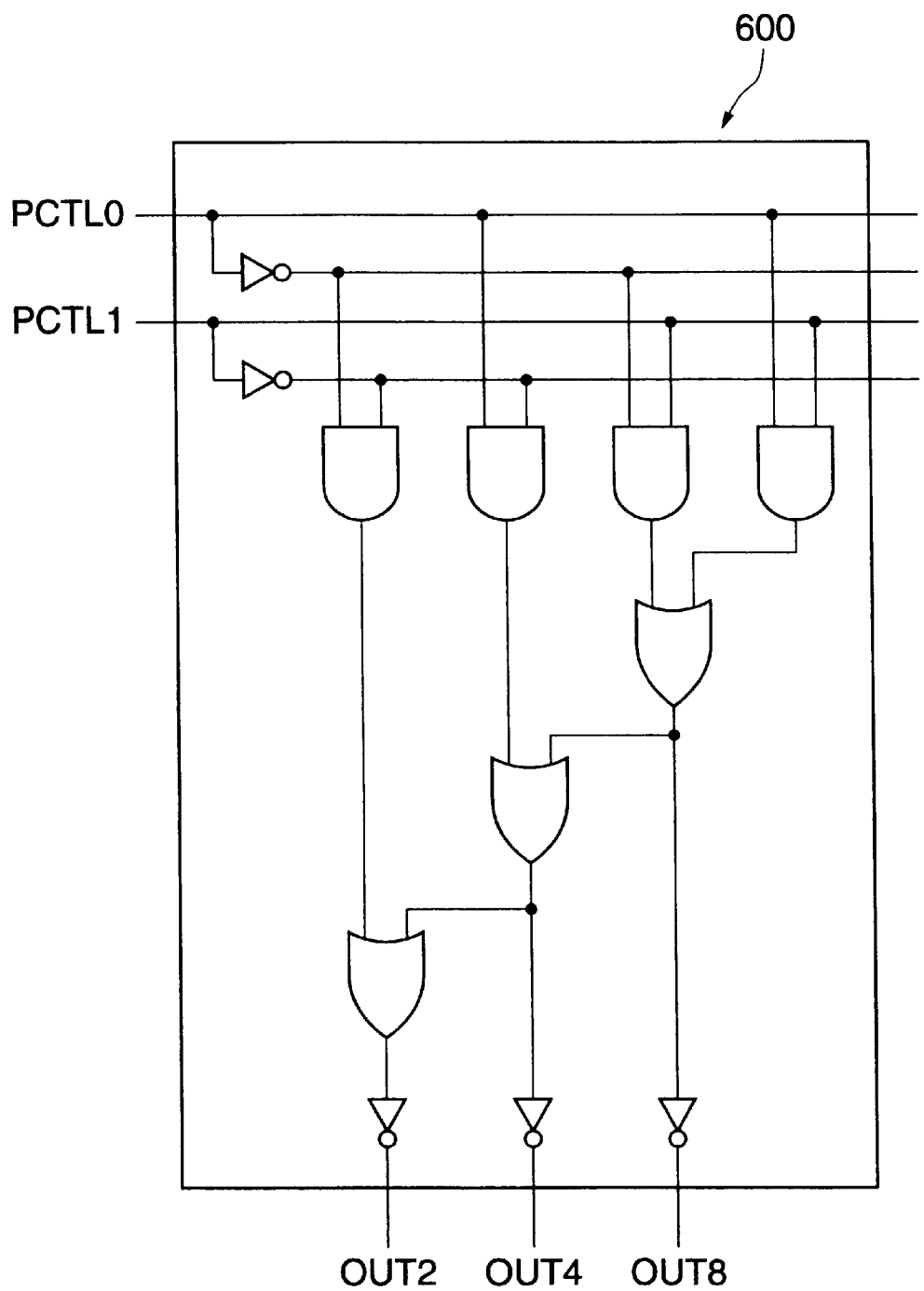
FIG. 10 is a diagram showing the construction of a control signal-generating block 600.

Which mode should be selected for driving the load is determined by the control signal OUT2 and/or other control signals OUT4, OUT8 from a control signal-generating block 600 shown in FIG. 10. The control signal-generating block 600 functions as shown in a FIG. 11 truth value table.

The drive switching control block 200' is comprised of a delay circuit 210, a control circuit 220, a second output block control circuit 230, and a third output block control circuit 240.

The control circuit 220 is comprised of an AND gate AND1, an inverter IN2, and an OR gate OR1. This circuit is similar in construction to corresponding circuits in the respective drive switching control blocks described in the first and second embodiments.

The delay circuit 210 is similar in construction to the delay block 210 in the first embodiment.

The second output block control circuit 230 is comprised of a NAND gate NAN2, a NOR gate NOR2, an AND gate AND2, an OR gate OR2, and an inverter IN3.

The control signal OUT4 is supplied to one of the input terminals of the OR gate OR2, whereas the inverter IN3 inverts the level of the control signal OUT4 supplied thereto and delivers the resulting inverted signal to one of the input terminals of the AND gate AND2. Further, an output signal r2 from the OR gate OR1 in the control circuit 220 is delivered to the other input terminal of the OR gate OR2, and an output signal a2 from the AND gate AND1 in the control circuit 220 is delivered to the other input terminal of the AND gate AND2.

Further, an output signal r3 from the OR gate OR2 is delivered to one of the input terminals of the NOR gate NOR2, while an output signal a3 from the AND gate AND2 is delivered to one of the input terminals of the NAND gate NAN2. The other terminal of the NOR gate NOR2 and that of the NAND gate NAN2 are each supplied with an input signal i.

Output signals from the NAND gate NAN2 and the NOR gate NOR2 are supplied to the respective gates of the P-channel and N-channel MOS transistors MP2, MN2 in the second output block 300, respectively.

The second output block control circuit 230 is constructed as above.

The third output block control circuit 240 is arranged at a location upstream of the third control block 500. The circuit 240 is constructed similarly to the second output block control circuit 230. A NAND gate NAN3, a NOR gate NOR3, an AND gate AND3, an OR gate OR3, and an inverter IN4 in the third output block control circuit 240 correspond to the NAND gate NAN2, the NOR gate NOR2, the AND gate AND2, the OR gate OR2, and the inverter IN3 in the second output block control circuit 230, respectively. However, the third output block control circuit 240 is distinguished from the second output block control circuit 230 in that the control signal OUT8 is supplied to the OR gate OR3 and the inverter IN4.

Next, the operation of the output buffer circuit of the present embodiment will be described.

a. Low-speed Mode

When input signals PCTL0 and PCTL1 delivered to the control signal-generating block 600 are both set to L levels, the control signal OUT2 alone is set to an L level (low level), whereas the other control signals OUT4 and OUT8 are both set to an H level (high level) (see FIG. 11). In this state, when the enable signal en is set to an L level, the operational mode of the output buffer circuit is switched to the low-speed mode.

In the low-speed mode, the output signal r3 and an output signal r4 from the respective OR gates OR2 and OR3 are each forcibly held at an H level, and the output signal a3 and an output signal a4 from the respective AND gates AND2 and AND3 are each forcibly held at an L level. As a result, all the transistors forming the second output block 230 and the third output block 500 are brought into the OFF-state. On the other hand, an output signal from the OR gate OR0 is held at an L level, and an output signal from the inverter IN1 at an L level.

Thus, in the low-speed mode, the transistors MP1 and MN1 in the first output block 100 are turned on and off in response to the input signal i, and the load connected to the output terminal 400 is driven only by these transistors.

b. Middle-Speed Mode

When the input signal PCTL0 delivered to the control signal-generating block 600 is set to an H level and the input signal PCTL1 to the L level, the control signals OUT2 and OUT4 are both set to the L level, and the control signal OUT8 alone is set to the H level (see FIG. 11). In this state, when the enable signal en is set to the L level, the operational mode of the output buffer circuit is switched to the middle-speed mode.

In the middle-speed mode, the output signal from the OR gate OR3 is forcibly held at the H level, and the output signal from the AND gate AND3 is forcibly held at the L level, so that all the transistors forming the third output block 500 are brought into the OFF-state.

On the other hand, the output signal from the OR gate OR0 is held at the L level, and the output signal from the inverter IN1 at an H level, and hence the transistors MP1 and MN1 in the first output block 100 are turned on and off in response to the input signal i.

Further, since the control signal OUT4 is at the low level, the output signals a2 and r2 from the AND gate AND1 and the OR gate OR1 in the control circuit 220 are supplied to the NAND gate NAN2 and the NOR gate NOR2, respectively, as the signal a3 and the signal r3.

Accordingly, in the middle-speed mode, e.g. when the input signal i changes from the L level to the H level, the P-channel MOS transistor MP2 in the second output block 300 is held in the ON-state over a predetermined time period after the level change. On the other hand, when the input signal i changes from the H level to the L level, the N-channel MOS transistor MN2 in the second output block 300 is held in the ON-state over a predetermined time period after the level change.

Thus, in the middle-speed mode, the second output block 300 provides additional or augmenting drive power to make up for the drive power obtained from the first output block 100.

c. High-speed Mode

When the input signals PCTL0 and PCTL1 delivered to the control signal-generating block 600 are both set to the H level, all the control signals OUT2, OUT4 and OUT8 are set to the L level (see FIG. 11). In this state, when the enable signal en is set to the L level, the operational mode of the output buffer circuit is switched to the high-speed mode.

In the high-speed mode, the output signal from the OR gate OR0 is held at the L level, while the output signal from the inverter IN1 is held at the H level. As a result, the transistors MP1 and MN1 in the first output block 100 are turned on and off in response to the input signal i. Further, since the control signals OUT4 and OUT8 are held at the L level, the output signal a2 from the AND gate AND1 in the control circuit 220 is supplied to the NAND gates NAN2 and NAN3, while the output signal r2 from the OR gate OR1 is supplied to the NOR gates NOR2 and NOR3.

Accordingly, in the high-speed mode, e.g. when the input signal i changes from the L level to the H level, the P-channel MOS transistor MP2 in the second output block 300 and the P-channel MOS transistor MP3 in the third output block 500 are held in the ON-state over a predetermined time period after the level change of the input signal i. On the other hand, when the input signal i changes from the H level to the L level, the N-channel MOS transistor MN2 in the second output block 300 and the N-channel MOS transistor MN3 in the third output block 500 are held in the ON-state over a predetermined time period after the level change of the input signal i.

Thus, in the high-speed mode, the second output block 300 and the third output block 500 provide additional or augmenting drive powers to make up for the drive power obtained from the first output block 100.

d. High-impedance Mode

Figure 12:
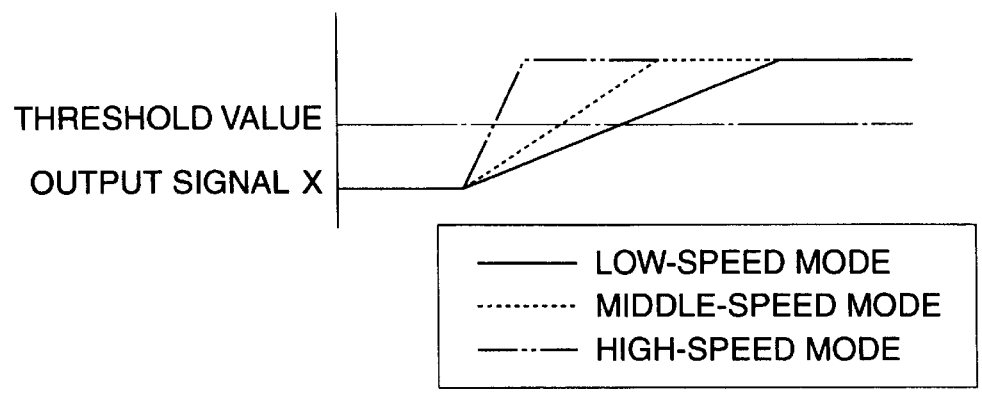
FIG. 12 is a diagram showing changes in rise of an output signal x in each speed mode.

When the enable signal en is set to an H level, the output signals from the respective OR gates OR1, OR2 and OR3 are each forcibly changed to the H level, while the output signals from the inverter IN1 and the AND gates AND1, AND2 and AND3 are each forcibly changed to the L level. As a result, all the transistors forming the first output block 100', the second output block 300 and the third output block 500 are turned off, and the output terminal 400 is brought into a high-impedance state.

e. Changes in Level of Output Signal x in Low-Speed Mode, Middle-speed Mode and High-Speed Mode FIG. 12 shows changes in rise of an output signal x in the respective speed modes in response to the change of the input signal i from the low level to the high level.

In the low-speed mode, the load connected to the output terminal 400 is charged by the P-channel MOS transistor MP1 alone as described above, so that the level of the output signal x rises slowly. On the other hand, in the middle-speed mode, the load is charged by the P-channel MOS transistors MP1, MP2, and hence the output signal x rises faster than in the low-speed mode. Further, in the high-speed mode, the load is charged by the P-channel MOS transistors MP1, MP2 and MP3, and hence the output signal x rises still faster than in the middle-speed mode.

As described above, according to the present embodiment, it is possible to switch the speed mode to thereby change the speed at which the output signal x rises. More specifically, it is possible to switch between a high-speed charge and a low-speed charge according to the capacity of a load connected to the output terminal 400 of the output buffer circuit.

Figure 13:
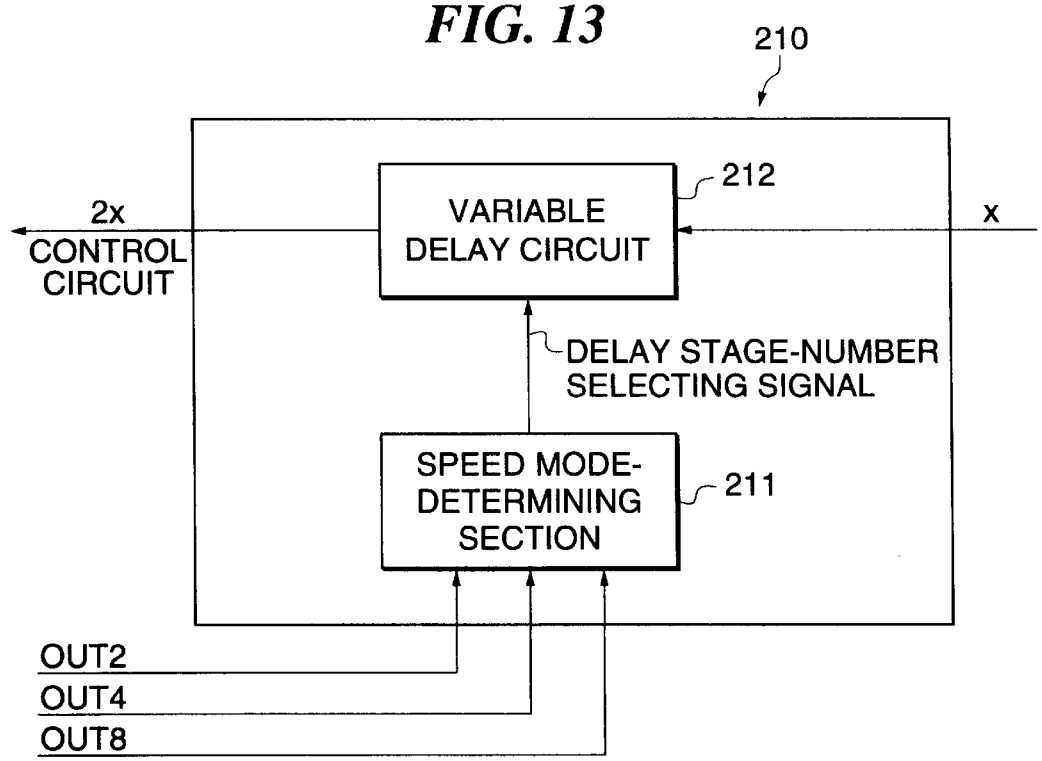
FIG. 13 is a diagram showing the construction of a delay block 210'.

In the output buffer circuit according to the present embodiment described above, the delay block 210 may be constructed such that its delay time can be set differently in the respective speed modes. For example, the output buffer circuit may be provided with a delay block 210' constructed as shown in FIG. 13.

The delay block 210' is comprised of a speed mode-determining section 211, and a variable delay circuit 212.

The speed mode-determining section 211 is supplied with the control signals OUT2, OUT4 and OUT8 and determines the speed mode of the output buffer circuit based on the signal levels of the respective control signals. Then, the section 211 generates a delay stage number-selecting signal based on the result of the determination and delivers the generated delay stage number-selecting signal to the variable delay circuit 212.

For example, when the received control signals OUT2 and OUT4 are both at the low level, and the control signal OUT8 at the high level, the speed mode-determining section 211 determines that the output buffer circuit is in the middle-speed mode (see FIG. 11). Then, the speed mode-determining section 211 generates a delay stage number-selecting signal corresponding to the middle-speed mode and delivers the generated signal to the variable delay circuit 212.

The variable delay circuit 212 changes setting of the delay time in response to the delay stage number-selecting signal.

The variable delay circuit 212 is comprised of a plurality of inverters, AND gates, OR gates, and so forth. The circuit 212 changes the delay time based on the delay stage number-selecting signal. More specifically, upon receiving the output signal x, the variable delay circuit 212 changes the number of delay stages to be used, in response to the delay stage number-selecting signal delivered from the speed mode-determining section 211. Then, after the lapse of the delay time set by changing the number of the delay stages, the variable delay circuit 212 delivers an output signal x2 formed by inverting the polarity of the output signal x to the control circuit 220.

The number of the delay stages to be used in the variable delay circuit 212 is set such that the signal level of the output signal x2 from the delay block changes simultaneously with a complete rise of the output signal x.

By providing the delay circuit 210' constructed as above in the output buffer circuit, it is possible to change the level of the output signal x accurately.

Although in the output buffer circuit according to the present embodiment, the output signal x from the first output block 100' is supplied to the drive switching control block 200', this is not limitative, but the output buffer circuit may be constructed, similarly to the output buffer circuit according to the second embodiment, such that the input signal i is supplied to the drive switching control block 200'.

What is claimed is:

1. An output buffer circuit comprising:
   an output terminal;
   a pair of first and second switching elements that are connected with each other at a common junction and connected in series with a power supply, for being exclusively switched on and off in response to an input signal such that said first and second switching elements are riot simultaneously on or off, to deliver an output signal corresponding to said input signal, from said common junction;
   a first auxiliary switching device that is connected in parallel with said first switching element;
   a second auxiliary switching device that is connected in parallel with said second switching element; and
   a drive switching control block that operates when a change occurs in a level of said input signal and one of signal first and second switching elements is switched from an OFF state to an ON state in response to said change in the level of said input signal, to deliver auxiliary drive control signals to one of said first and second auxiliary switching devices which is connected in parallel with the switched one of said first and second switching elements, for simultaneously holding said one of said first and second auxiliary switching devices in a ON state over a predetermined time period, wherein said drive switching control block includes a delay circuit arranged in a feedback loop from said output terminal to inputs of said first and second auxiliary switching devices, for delaying the output signal delivered from said common junction between said first and second switching elements.

2. An output buffer circuit according to claim 1, wherein said drive switching control block delivers said auxiliary drive control signals over a time period during which a level of an output signal from said delay circuit and the level of said input signal are the same as each other.

3. An output buffer circuit according to claim 2, wherein said delay circuit delays said output signal delivered to said common junction between said first and second switching elements by a delay time dependent on a speed of switching operation determined by the capacity of the load connected to the output terminal of said output buffer circuit.

4. An output buffer circuit comprising:

an output terminal;

a pair of first and second switching elements that are connected with each other at a common junction and connected in series with a power supply, for being exclusively switched on and off in response to an input signal such that said first and second switching elements are pot simultaneously on or off, to deliver an output signal corresponding to said input signal, from said common junction;

a first auxiliary switching device that is connected in parallel with said first switching element, said first auxiliary switching device being formed by a plurality of switching elements;

a second auxiliary switching device that is connected in parallel with said second switching element, said second auxiliary switching device being formed by a plurality of switching elements;

a selection control signal supply device that delivers selection control signals for selecting or not selecting at least one of said plurality of switching elements to be supplied with auxiliary drive control signals;

a drive switching control block that operates when a level of said input signal changes to switch one of said first and second switching elements from an OFF state to an ON state, to deliver said auxiliary drive control signals to the selected at least one of said plurality of switching elements of one of said first and second auxiliary switching devices which is connected in parallel with the switched one of said first and second switching elements, for simultaneously holding the selected at least one of said plurality of switching elements in the ON state over a predetermined time period, wherein said drive switching control block includes a delay circuit arranged in a feedback loop from said output terminal to inputs of said first and second auxiliary switching devices, for delaying the output signal delivered from said common junction between said first and second switching elements.

5. An output buffer circuit according to claim 4, wherein said selection control signal supply device delivers said selection control signals such that more of said plurality of switching elements are selected to be supplied with said auxiliary drive control signals to thereby increase a speed of rise of said output signal.

6. An output buffer circuit according to claim 4, wherein said drive switching control block delivers said auxiliary drive control signals over a time period during which a level of an output signal from said delay circuit and the level of said input signal are the same as each other.

7. An output buffer circuit according to claim 6, wherein said delay circuit delays said output signal delivered to said common junction between said first and second switching elements by a delay time dependent on a speed of switching operation determined by the capacity of the load connected to the output terminal of said output buffer circuit.

* * * * *